(12) United States Patent
Shimizu et al.

(10) Patent No.: US 6,331,804 B1
(45) Date of Patent: Dec. 18, 2001

(54) AMPLIFIER AND RADIO COMMUNICATION APPARATUS USING THE SAME

(75) Inventors: Yoshito Shimizu; Noriaki Saito; Hiroyuki Yabuki, all of Kanagawa (JP)

(73) Assignee: Matsushita Electric Industria, Co., Ltd., Osaka (JP)

(*) Notice: Subject to any disclaimer, the term of this patent is extended or adjusted under 35 U.S.C. 154(b) by 0 days.

(21) Appl. No.: 09/487,849

(22) Filed: Jan. 19, 2000

(30) Foreign Application Priority Data

Jan. 19, 1999 (JP) .................................. 11-010147
Jun. 15, 1999 (JP) .................................. 11-167920
Nov. 8, 1999 (JP) .................................. 11-316742

(51) Int. Cl.[7] .................................................. H03G 3/30
(52) U.S. Cl. ........................ 330/285; 330/51; 330/124 R
(58) Field of Search .............................. 330/51, 124 R, 330/285, 295, 310, 311

(56) References Cited

U.S. PATENT DOCUMENTS

| | | | |
|---|---|---|---|
| 4,348,645 | * | 9/1982 | Ushida et al. ........................ 330/306 |
| 5,327,097 | * | 7/1994 | Igarashi et al. ....................... 330/311 |
| 5,880,639 | * | 3/1999 | Sakuragi ............................... 330/252 |
| 5,903,854 | * | 5/1999 | Abe et al. ........................ 330/124 R |
| 6,011,431 | * | 1/2000 | Gilbert ................................. 330/305 |
| 6,118,989 | * | 9/2000 | Abe et al. ............................... 330/51 |

FOREIGN PATENT DOCUMENTS 1-30312   2/1989   (JP) .

* cited by examiner

Primary Examiner—Robert Pascal
Assistant Examiner—Khanh Van Nguyen
(74) Attorney, Agent, or Firm—Ratner & Prestia P.C.

(57) ABSTRACT

In a cascade amplifier, the collector of a first transistor with a grounded emitter and the emitter of a second transistor are connected. A third transistor has the base grounded at radio frequency, the emitter connected to the base of the first transistor, and the collector connected to the collector of the second transistor. A fourth transistor connected to the emitter of the third transistor works as a constant current source. A bias changeover circuit supplies base biases of these transisiors. In this constitution, by using the bias changeover circuit for changing over the bias depending on the cut-off condition of the first transistor, the gain is changed over by making either the cascade amplifier or the third transistor operate.

12 Claims, 15 Drawing Sheets

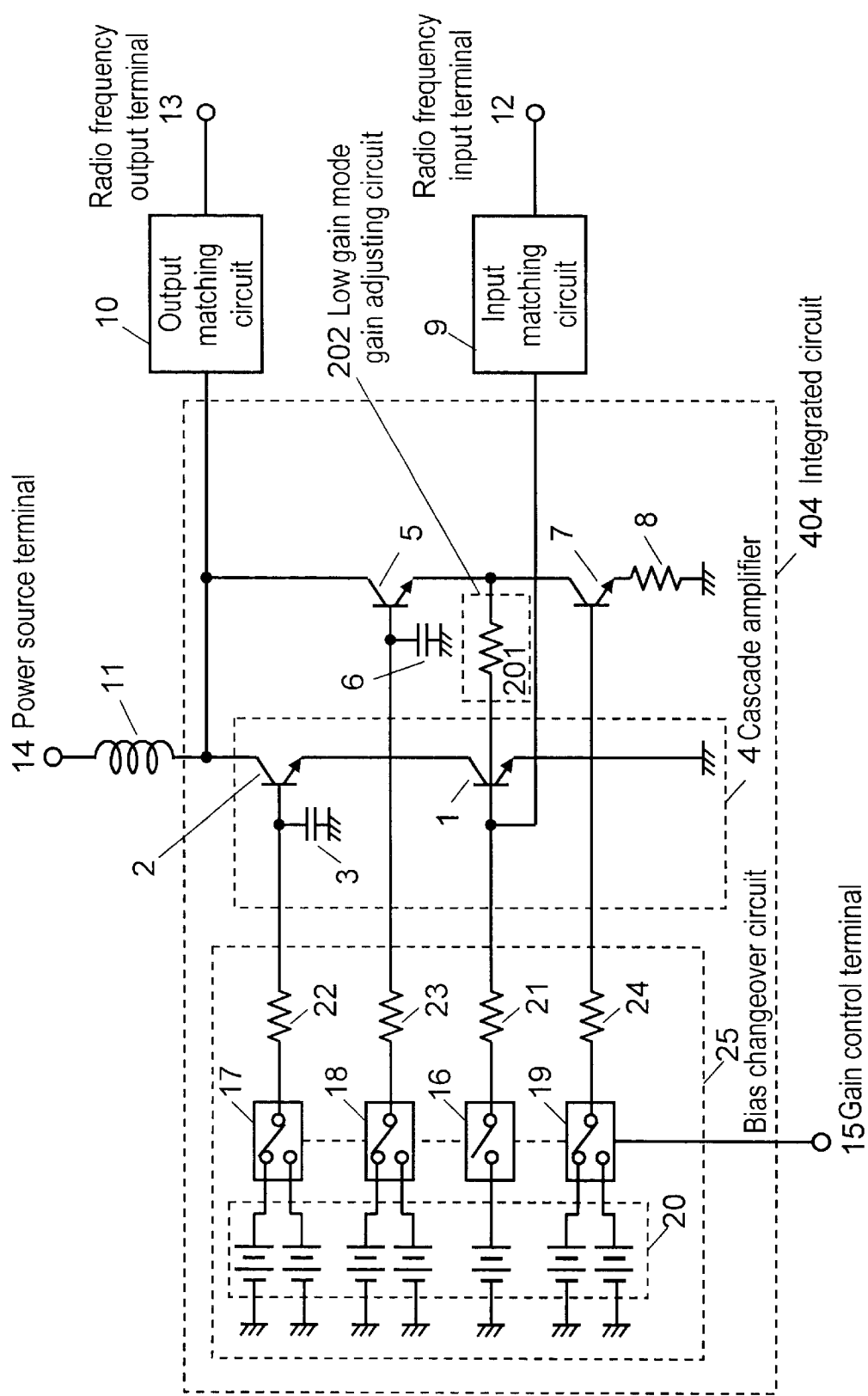

AMPLIFIER AND RADIO COMMUNICATION APPARATUS USING THE SAME

BACKGROUND OF THE INVENTION

1. Field of the Invention

The present invention relates to an amplifier used at a receiving front end of a digital radio communication apparatus.

It also relates to a single side phase converter circuit for amplifying by single side phase conversion.

2. Description of the Related Art

In mobile communication, since the receiving electric field varies significantly depending on the distance between the base station and a mobile communication terminal, a wide dynamic range is required in the receiving system, and a gain control function is demanded in the low noise amplifier at the receiving front end. Besides, in the large-scale integration trend of the circuit, signal branching is indispensable in an integrated circuit.

Also in mobile communication, double side phase signals, it is advantageous to use double side phase signals because the incoming noise applied simultaneously in signal lines is eliminated. Thus, in the integrated circuit, this constitution is widely employed not only in the amplifier but also in the multiplier, oscillator and others. However, when a filter corresponding to double side phase signals is formed in the integrated circuit, the required area for inductor and capacitor is twice as wide as in the single side phase composition. Accordingly a circuit for converting a double side phase signal into a single side phase output is also needed. As the single side phase converter, it is general to connect the buffer of emitter follower type to the single side phase output of the differential amplifier.

A conventional variable gain amplifier is described below.

In a circuit diagram of a conventional variable gain amplifier in FIG. 13, a cascade amplifier is composed of transistors 1301, 1302, resistors 1303, 1304, inductor 1305, grounding capacitor 1306, input matching circuit 1307, output matching circuit 1308, gain control terminal 1309, power source terminals 1310, 1311, radio frequency input terminal 1312, and radio frequency output terminal 1313.

In this amplifier, in the case of weak input electric field, voltage Vagc1 for obtaining a high gain is applied to the gain control terminal 1309. At this time, the circuit composition of input matching circuit 1307 and output matching circuit 1308 and the inductance of inductor 1305 is set so that the input and output impedance of the amplifier coincide with the characteristic impedance of the transmission line. On the other hand, in the case of strong input electric field, voltage Vagc2 for low fain (Vagc2<Vagc1) is set in the gain control terminal 1309 so that the gain of the amplifier is decreased.

In the conventional constitution of the variable gain amplifier, however, when changing over the gain, the input impedance of the amplifier varies. Then the input impedance mismatches with the characteristic impedance of the transmission line. Moreover since the gain is decreased by lowering the current of transistor, higher order distortion due to nonlinear effect increases.

In a conventional signal branching method, two stages of amplifiers are prepared, and the signal is branched off by the output of the first stage amplifier, and the signal is amplified again by the second stage amplifier, thereby compensating for the loss due to branching.

Besides, in the conventional signal branching constitution, to branch the signal into a plural lines, a large current must be passed in the first stage amplifier.

A conventional single side phase converter is described.

FIG. 14 is a circuit diagram showing a conventional constitution of single side phase converter. In FIG. 14, a differential amplifier 700 is composed of a direct-current voltage source 704, transistors 707 and 708 sharing a common emitter terminal, a load resistor 706 connected to the collector side of the transistor 708, and a current source 709 connected to the common emitter terminal of the transistors 707, 708. An emitter follower 1100 is composed of a transistor 1101 and a direct-current current source 1102 connected to the emitter of the transistor 1101. In addition, FIG. 14 further shows a common mode signal input terminal 702, an inverting phase signal input terminal 703 for receiving a signal differing in phase by 180 degrees from that of the common mode signal input terminal 702, and an output terminal 712.

In thus constituted single side phase converter, the operation is described below.

First, double side phase signals input from the common mode signal input terminal 702 and inverting phase signal input terminal 703 are amplified by the differential amplifier 700. At this time, a negative phase output signal appears at the collector terminal of the transistor 707, and a positive phase output signal appears at the collector terminal of the transistor 708. By picking up this positive phase output signal through the load resistor 706, the double side phase signal can be converted into a single side phase signal. It is a common practice to omit the load resistor of the transistor 707 which does not pick up signal. Consequently, this positive phase output signal is taken out after converting the impedance in the emitter follower 1100 which is a non-inverting amplifier.

In this constitutions of the single side phase converter, since only the positive phase output of the double side phase output is taken out, half of the consumption current is not used. Another problem is that it is not possible to eliminate the in-phase noise which is an advantage of double side phase driving.

SUMMARY OF THE INVENTION

It is hence an object of the invention to present an amplifier keeping input matching and having an excellent higher order distortion characteristic even when changing over the gain by changeover of circuit by making use of cut-off voltage of transistor, and an amplifier realizing signal branching without requiring large current.

The variable gain amplifier of the invention is capable of obtaining a variable gain by changing over lines differing in the gain. It comprises at least a line having a cascade amplifier and a line having a base-ground-type-amplifier. Control terminals are provided independently in the cascade amplifier and base-ground amplifier, and the amplification factor is varied by changing over the control terminals.

Thus, a variable gain amplifier keeping input matching and having an excellent higher order distortion characteristic even when changing over the gain is obtained.

Moreover, an amplifier realizing signal branching without requiring large current is obtained.

The invention also presents an amplifier for amplifying a positive phase input signal by a non-inverting amplifier, amplifying a negative phase input signal by an inverting amplifier and connecting the both outputs through a coupling capacitor. Thereby the amplifier retains the feature as eliminating in-phase noise and converts the double side phase output into single side phase output efficiently.

The amplifier of the invention capable of converting an input signal into single side phase output signal is composed of a non-inverting amplifier for amplifying an input signal in positive phase and an inverting amplifier for amplifying the signal by inverting the phase, in a single side phase converter for converting double side phase input signal into single side phase signal and issuing. In the amplifier, signals of opposite phases are applied into the non-inverting amplifier and inverting amplifier respectively, and their outputs are connected through first and second coupling capacitors.

BRIEF DESCRIPTION OF THE DRAWINGS

FIG. 2B is a circuit diagram of another amplifier in embodiment 2 of the invention.

DESCRIPTION OF THE PREFERRED EMBODIMENTS

Preferred embodiments of the invention are described below while referring to FIG. 1 through FIG. 12.

(Embodiment 1)

Figure 12:
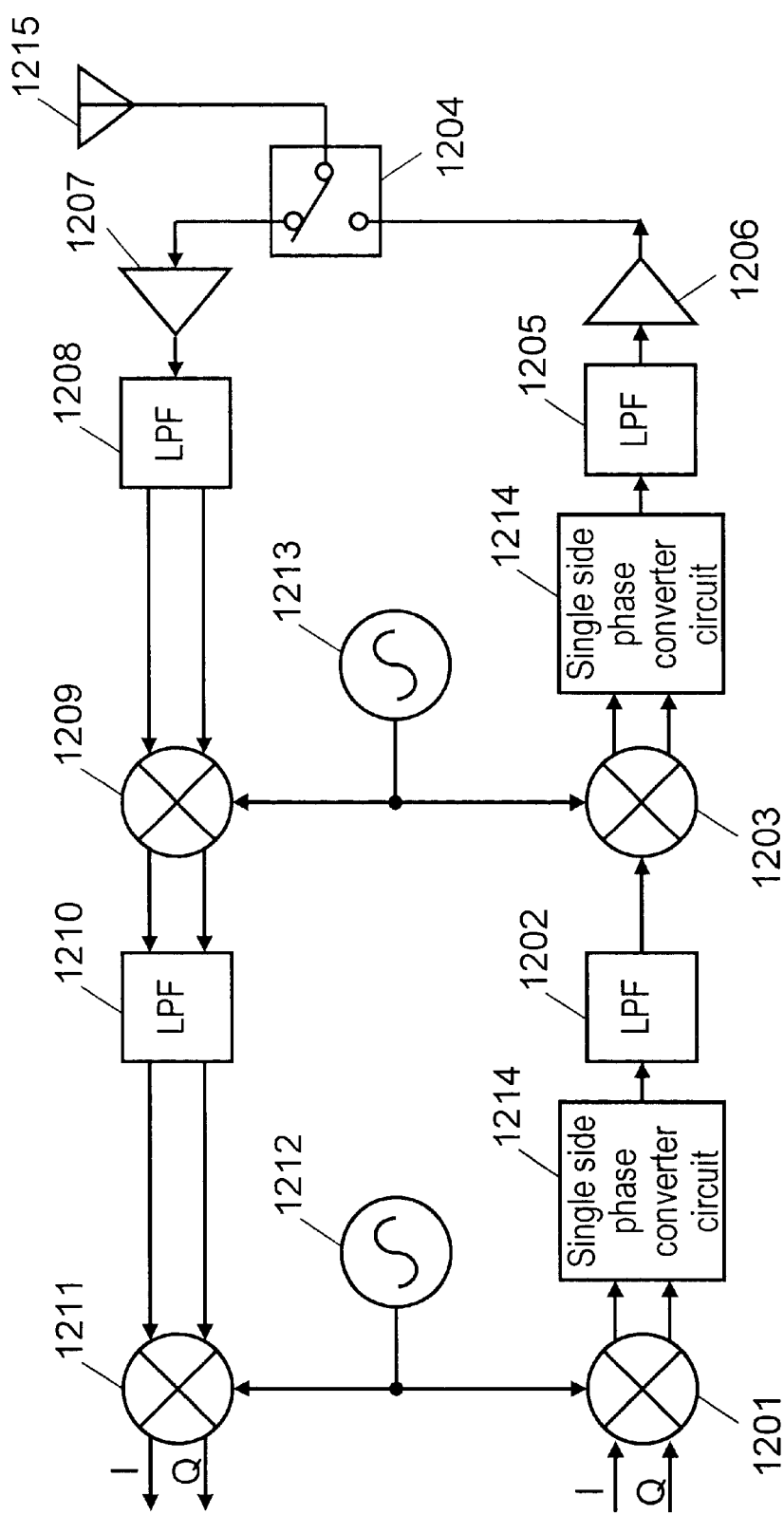
FIG. 12 is a general structural diagram of a radio apparatus of the invention.
Figure 13:
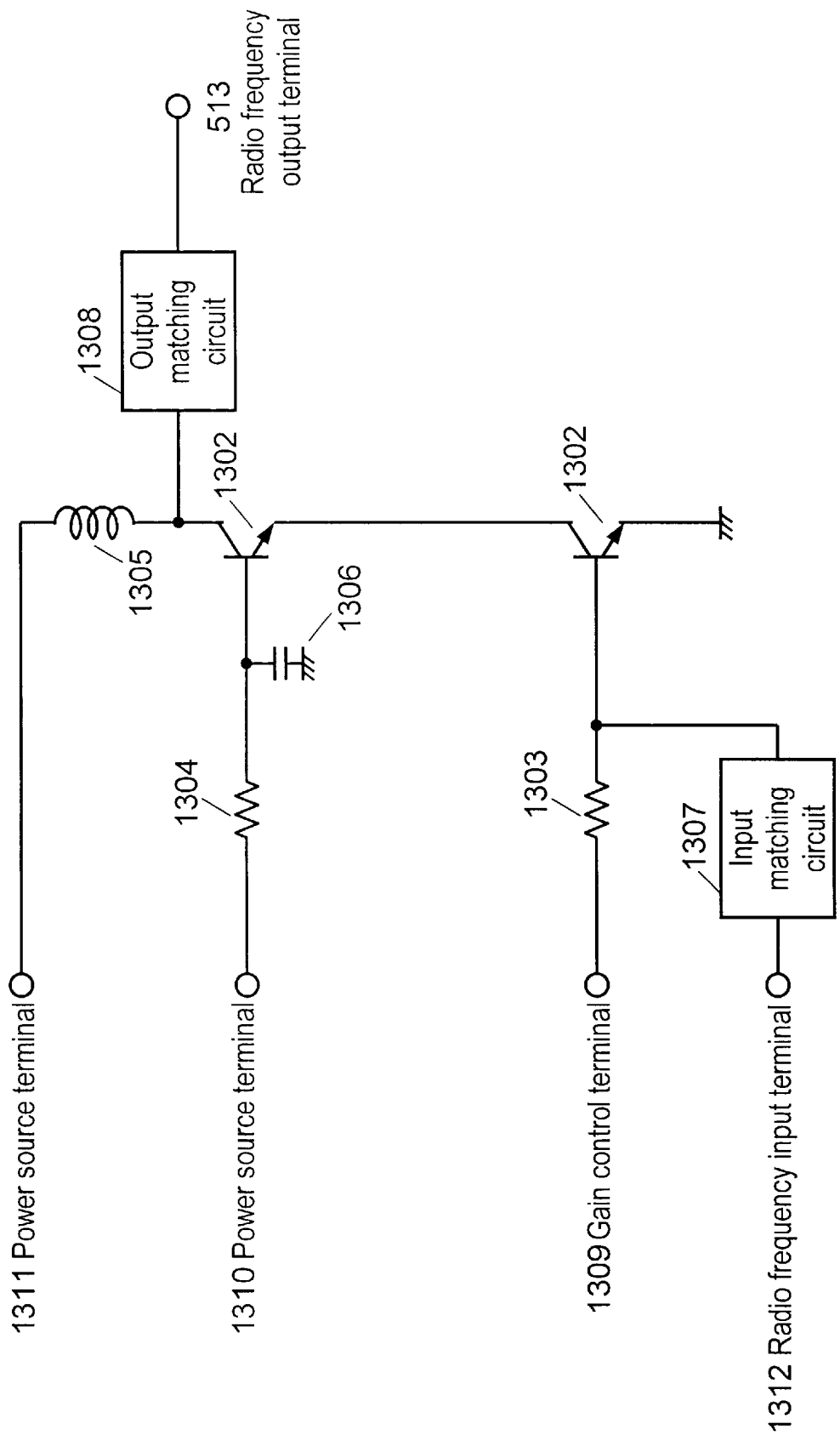
FIG. 13 is a circuit diagram of a conventional amplifier.
Figure 14:
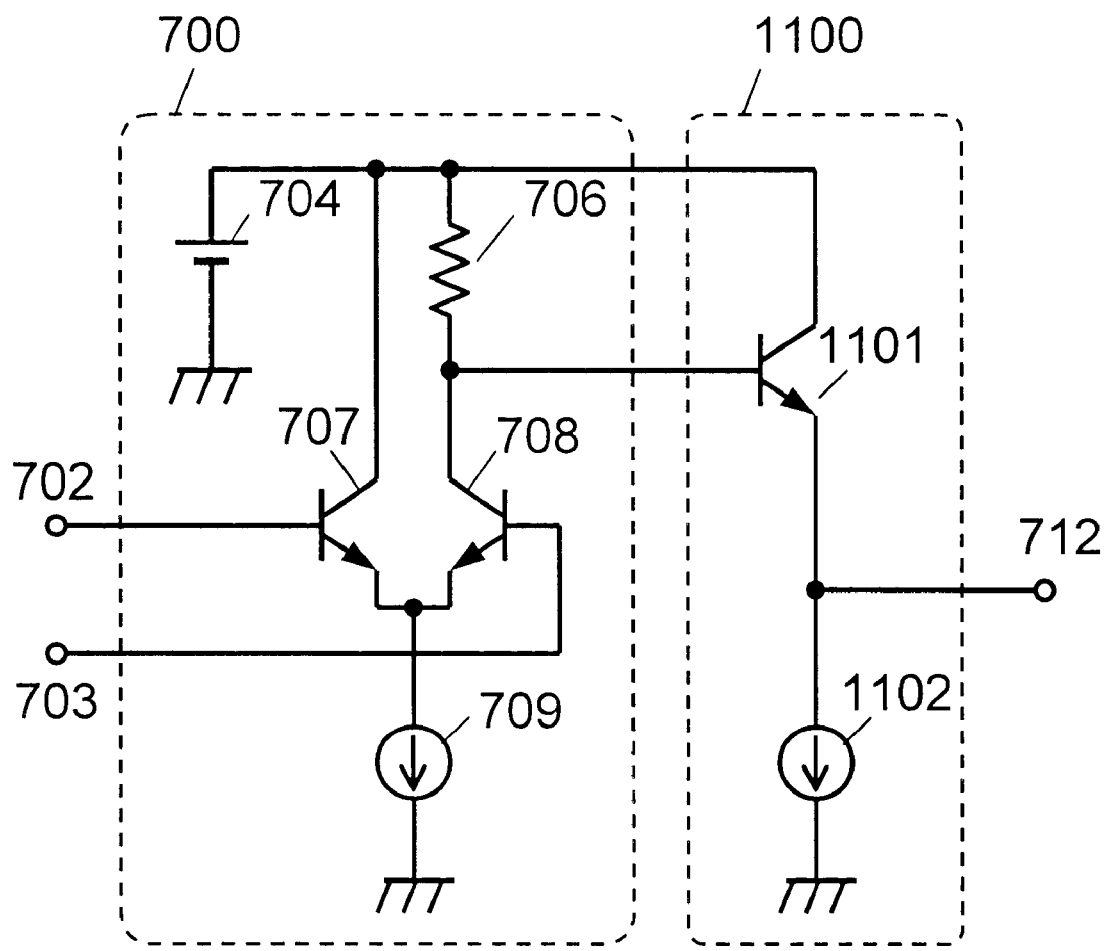
FIG. 14 is a circuit diagram of a conventional single side phase converter.
Figure 2A:
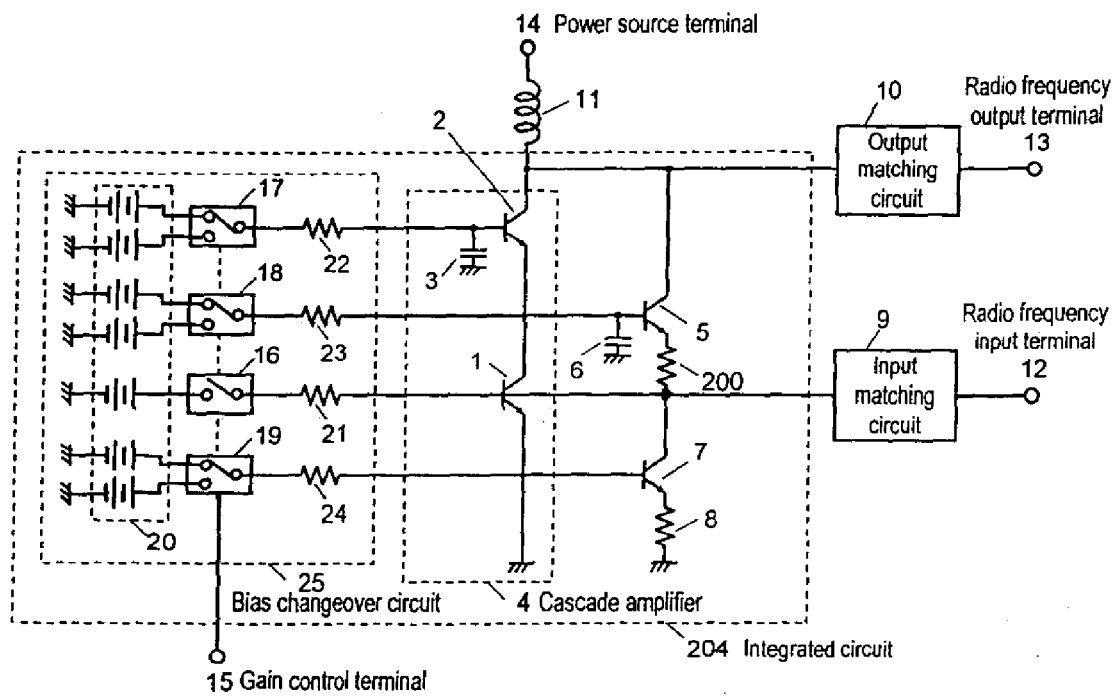

Referring to an example of digital radio communication apparatus, a Constitution of a radio apparatus is described. A block diagram is shown in FIG. 12.

In a transmitting system an In-phase/Quadrature-phase signal (hereinafter called I/Q signal) of baseband is input into a quadrature modulator 1201, and modulated in Intermediate Frequency (hereinafter called IF) band, and after suppressing higher harmonic components in a Low Pass Filter (hereinafter called LPF) 1202, the signal is up-converted to a transmission frequency in an up-mixer 1203. Undesired components are removed by a BPF 1205, and the signal is amplified to a desired output in a PA 1206, and is issued from an antenna 1215 through an antenna SW 1204 for changing over transmission and reception.

In a receiving system, a feeble reception signal entered from the antenna 1215 is input into a gain variable amplifier 1207 through the antenna SW 1204, and amplified at low noise, and then only the frequency components within the band is extracted in a BPF 1208. and in put into a down-mixer 1209 and down-converted to an IF frequency. Consequently, in an IF band BPF 1210, only a desired frequency is selected, and put into a quadrature demodulator 1211, and the I/Q signal of baseband is demodulated.

A first local oscillator 1213 has a function as local oscillating source for up-converting the transmission IF frequency to a transmission frequency, and down-converting the reception frequency to a reception IF frequency, and it distributes and supplies the output signal to the up-mixer and down-mixer.

A second local oscillator 1212 has a role of reference oscillation source for modulating a transmission baseband signal and demodulating a reception IF signal, and it distributes and supplies the output to the quadrature modulator and quadrature demodulator.

In thus constituted radio communication apparatus, in the receiving system, the receiving electric field varies significantly depending on the distance between the base station and a mobile communication terminal, and especially near the base station, since a large reception power is input, a gain control function is required in the variable gain amplifier 1207 at the receiving front end.

The variable gain amplifier 1207 in FIG. 12 is described in detail below.

Figure 1:
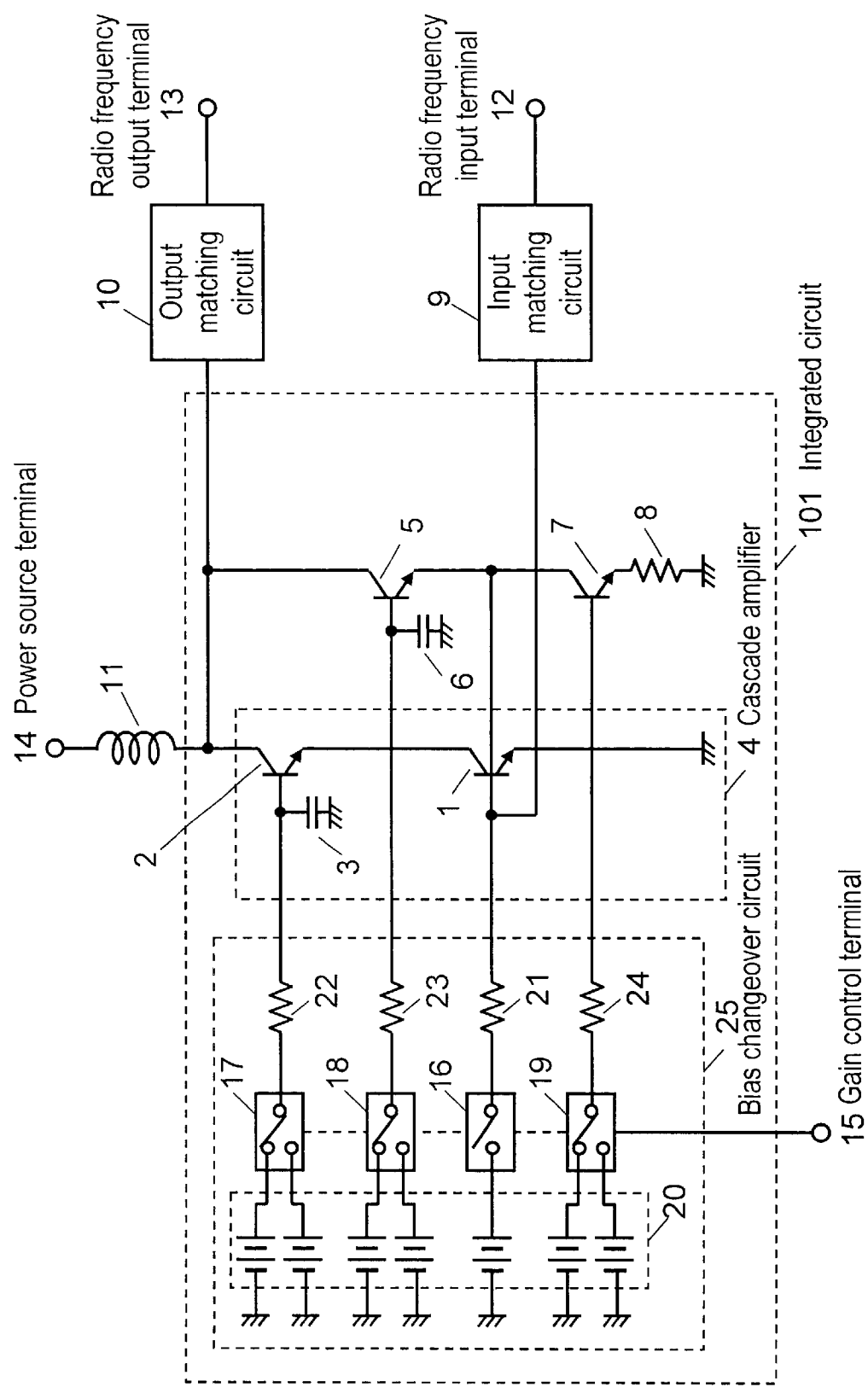
FIG. 1 is a circuit diagram of an amplifier in embodiment 1 of the invention.

The variable gain amplifier shown in FIG. 1 comprises an integrated circuit 101 composed of cascade amplifier 4, third transistor 5, second grounding capacitor 6, fourth transistor 7, emitter resistor 8, bias changeover circuit 25, and gain control terminal 15, and also an input matching circuit 9, an output matching circuit 10, a radio frequency input terminal 12, and a radio frequency output terminal 13.

The cascade amplifier is coin posed of a first transistor 1 having the emitter grounded directly, a second transistor 2 connected to the transistor 1 in cascade, and a first grounding capacitor 3 having the base of the transistor 2 grounded at radio frequency.

The bias changeover circuit 25 is composed of a gain control terminal 15, a first switch 16 For determining the base potential of the transistor 1, a second switch 17 for determining the base potential of the transistor 2, a third switch 18 for determining the base potential of the transistor 5, a fourth switch 19 for determining the base potential of the transistor 7, a power source 20, and resistors 21, 22, 23, 24 for applying a base bias to the transistors 1, 2, 5, 7.

The emitter of the transistor 5 is connected to the base of the transistor 1, and its collector is connected to the collector of the transistor 2. The grounding capacitor 6 has the base terminal of the transistor 5 grounded at radio frequency. The transistor 7 works as a constant current source connected to the emitter terminal of the transistor 5.

In addition, an inductor 11 supplying a collector bias to the transistors 2, 5, and matching the output together with the output matching circuit 9, and a power source terminal 14 are disposed.

The operation of embodiment 1 is described below.

A radio frequency signal input from the radio frequency input terminal 12 is put into the base of the transistor 1 and the emitter of the transistor 5 through the input matching circuit 9.

At the time of weak input electric field, by applying voltages V1$a$, V2$a$ for operating the transistor 1 and transistor 2 in an active region to the base terminals of these two transistors, a desired gain G1 is obtained. At this time, voltages V3a, V4a placing the transistor 5 and transistor 7 in a cut-off region are applied to the base terminals of these two transistors. At this time, since the radio frequency signal input from the radio frequency input terminal 12 is output from the radio frequency, output terminal 13 by passing through the cascade amplifier 4 only, the gain and noise figure characteristics are hardly deteriorated as compared with the cases of using the cascade amplifier alone.

On the other hand, at the time of strong input electric field, using the bias changeover circuit 25, the transistors are controlled as described below.

a) The voltage V1a applied to the base of the transistor 1 at the time of weak input electric field is released.

b) The voltage V2b for keeping the transistor 2 in the cut-off region is applied to the base of this transistor.

c) The voltage V4b for keeping the transistor 7 in the active region is applied to the lease of this transistor.

d) The voltage V3b for keeping the transistor 5 in the active region, the transistor 1 in the cut-off region, and the transistor 7 in the active region is applied to the base of the transistor 5.

At this time, the radio frequency signal entered from the radio frequency input terminal 12 is issued from the radio frequency output terminal 13 by passing through the transistor 5 only. Therefore, by selecting proper values for V3b and V4b for satisfying the conditions of c) and d), a desired gain G2 (G2<G1) is obtained.

In this manner, it a desired gain difference, the gain of the amplifier can be changed over between when the input signal is weak electric field and when it is strong electric field.

Herein, at low gain for curtailing the current, since the base-ground transistor alone is used as the low gain circuit, it is free from higher order distortion due to nonlinear effect of the emitter-ground transistor at the input stage, and the higher order distortion characteristic is improved from the case of using the cascade amplifier alone. Moreover, the input impedance of the cascade amplifier is not so high due to the effect of input capacitance at radio frequency, and is not so much different from the input impedance of the base-ground transistor. Therefore, if the gain is changed over in such a manner the input impedance matching can be maintained.

In this constitution, the cascade amplifier as high gain circuit and the third transistor as low gain circuit are connected without using capacitor incorporated in the integrated circuit having stray capacitance component to the ground. As a result, at high gain, there is almost no deterioration in the gain and noise figure characteristics in the cascade amplifier alone.

(Embodiment 2)

Figure 2A:
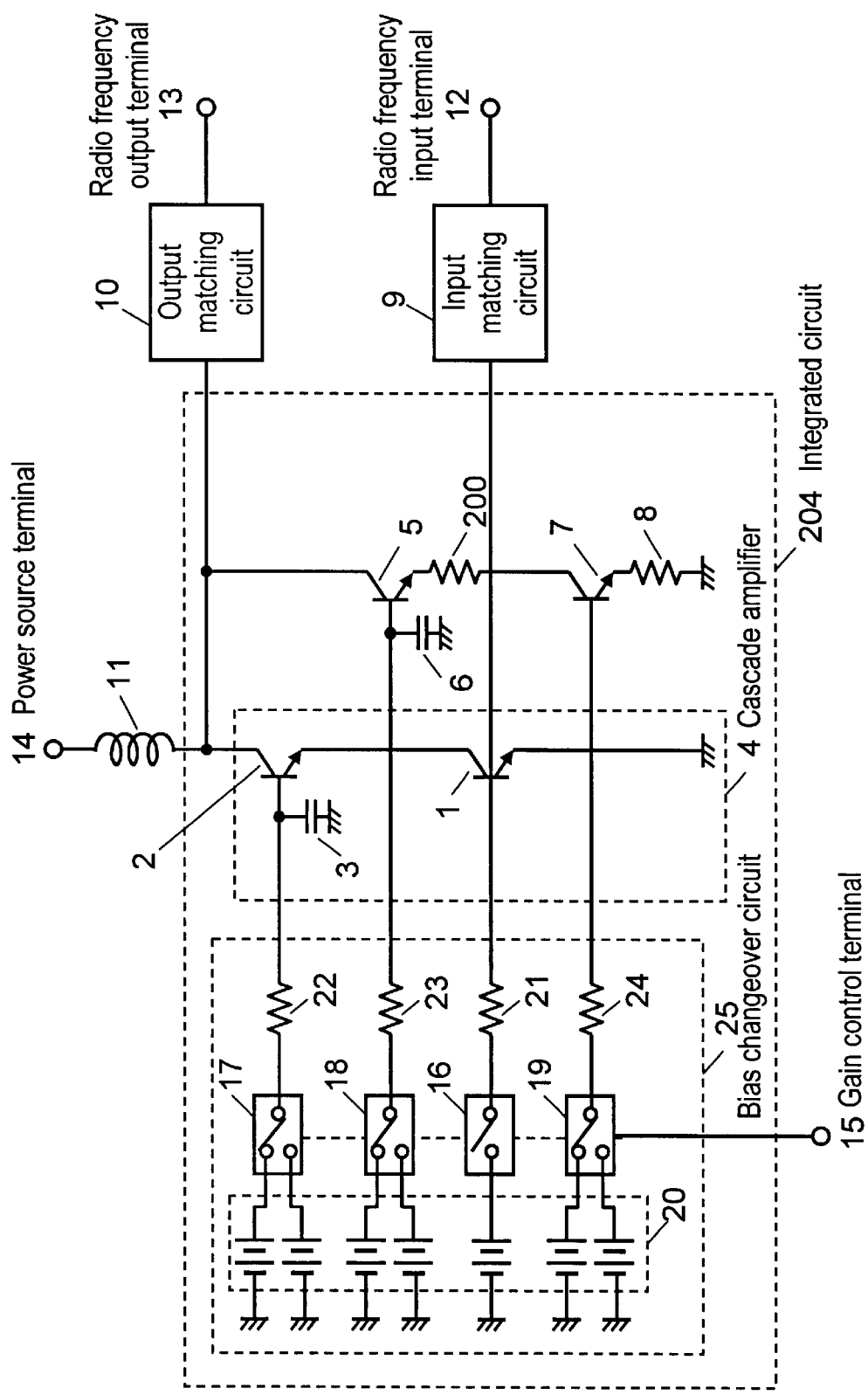
FIG. 2A is a circuit diagram of an amplifier in embodiment 2 of the invention.

In an integrated circuit 204 of the amplifier shown in FIG. 2A, a second emitter resistor 200 connected to the emitter of the third transistor 5 for decreasing the gain at low gain is added to the circuit in embodiment 1.

In an integrated circuit 404 of the amplifier shown in FIG. 2B, a low gain mode gain adjusting circuit 202 connected between the connecting point of the emitter of the third transistor 5 and the collector of the fourth transistor 7, and the base of the first transistor 1 is added to the circuit in embodiment 1. The low gain mode gain adjusting circuit 202 is composed of an input resistor 201 for decreasing the gain at the time of low gain.

By selecting a proper value for the emitter resistor 200 or input resistor 201, the input signal to the third transistor 5 at the time of low gain is attenuated. Therefore the gain at low gain can be adjusted regardless of the gain at high gain. Hence, while suppressing generation of higher order distortion, a wider dynamic range than in embodiment 1 is realized.

(Embodiment 3)

Figure 3:
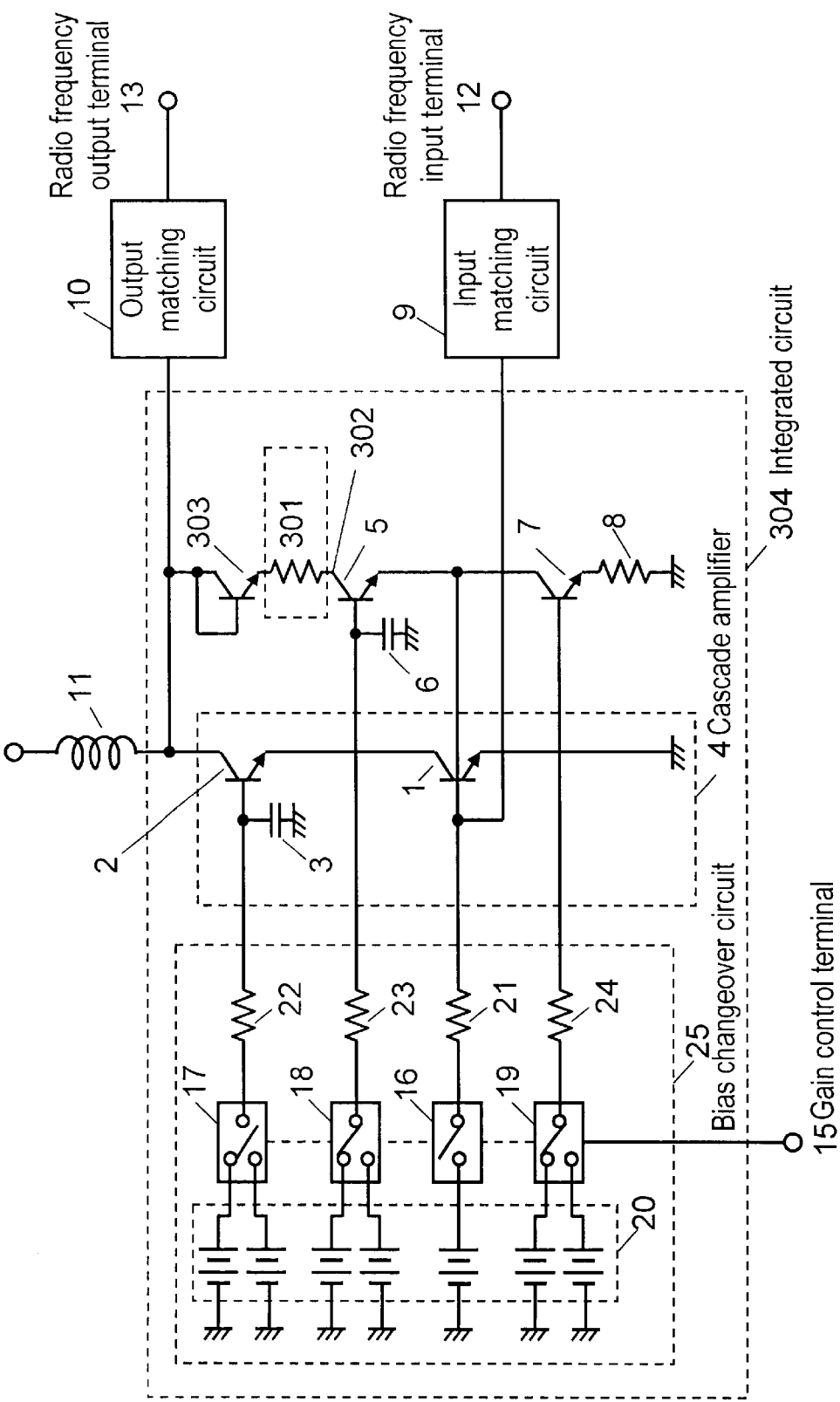
FIG. 3 is a circuit diagram of an amplifier in embodiment 3 of the invention.

In FIG. 3, a low gain mode gain adjusting circuit 302 is composed of an output resistor 301 for attenuating the output signal of the transistor 5. In an integrated circuit 304, these constituent elements are added to embodiment 1.

For higher integration of transistors, depending on the allocation of transistors, the wiring length may be long(g between the base of the transistor 1 and the emitter of the transistor 5. At this time, between the base of the first transistor 1 and the ground, and between the emitter of the transistor 5 and the ground, the wiring capacitance characteristic of the integrated circuit increases. Depending on the combination of the resistor for gain adjustment at low gain connected to the emitter of the transistor 5 and this increased wiring capacitance, it may give rise to deterioration of gain and noise figure characteristics of the cascade amplifier 4 at high gain. To avoid this, the gain at low gain is adjusted by the output resistor 301 connected to the collector of the transistor 5.

In the case of an ideal transistor model, the impedance of the collector of the third transistor 5 is very high, the output resistor 301 has no effect on the output power of the cascade amplifier 4 at high gain. However, in an actual integrated circuit or the like, if the impedance of the collector of the transistor 5 is lowered due to electrode capacitance and wiring capacitance, it is possible that the output power of the cascade amplifier 4 at high gain may be damped by the output resistor 301. Herein, the damping action by the output resistor 301 is suppressed by making use of the separation characteristic between the collector and emitter in the non-action mode of the transistor 303.

(Embodiment 4)

Figure 4:
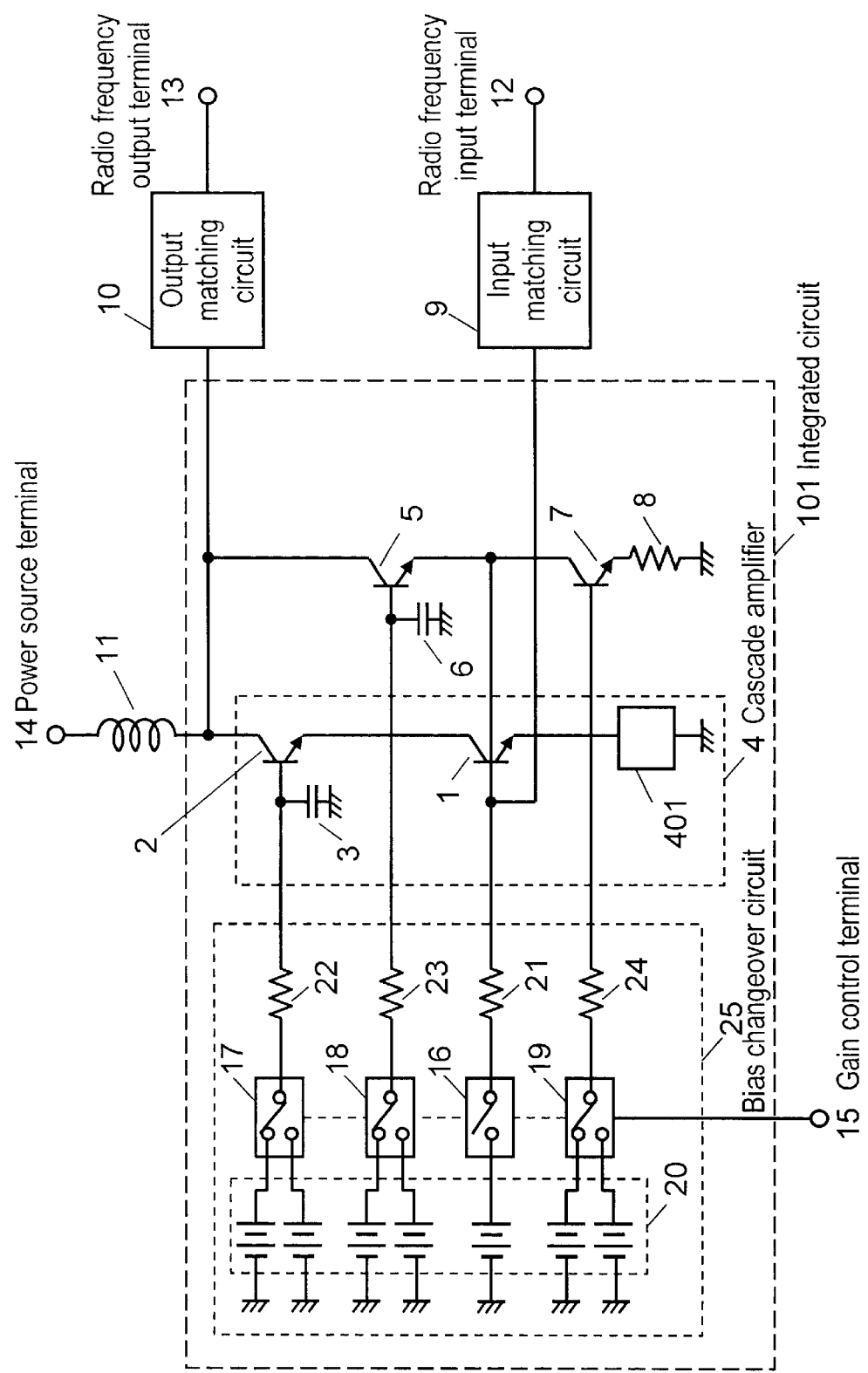
FIG. 4 is a circuit diagram of an amplifier in embodiment 4 of the invention.

As shown in FIG. 4, in this embodiment, an impedance adjusting circuit 401 is added to the circuit of the first embodiment. The impedance adjusting circuit 401 makes use of the impedance of the bonding wire for connecting the integrated circuit chip to the substrate.

By adjustment of the impedance connected to the emitter of the cascade amplifier 4, the matching point for achieving maximum gain at the operating frequency and the matching point of minimum noise figure may be set closer to each other. In the impedance adjusting circuit 401, the impedance is adjusted by extending or shortening the bonding wire length, or increasing or decreasing the number of wires.

(Embodiment 5)

Following explanations are about local oscillators 1212, 1213 in FIG. 12.

The circuit of signal distribution section is composed of two stages of amplifiers. The signal is branched by the output of the first stage amplifier. The distribution loss is compensated by the second stage amplifier.

Figure 5:
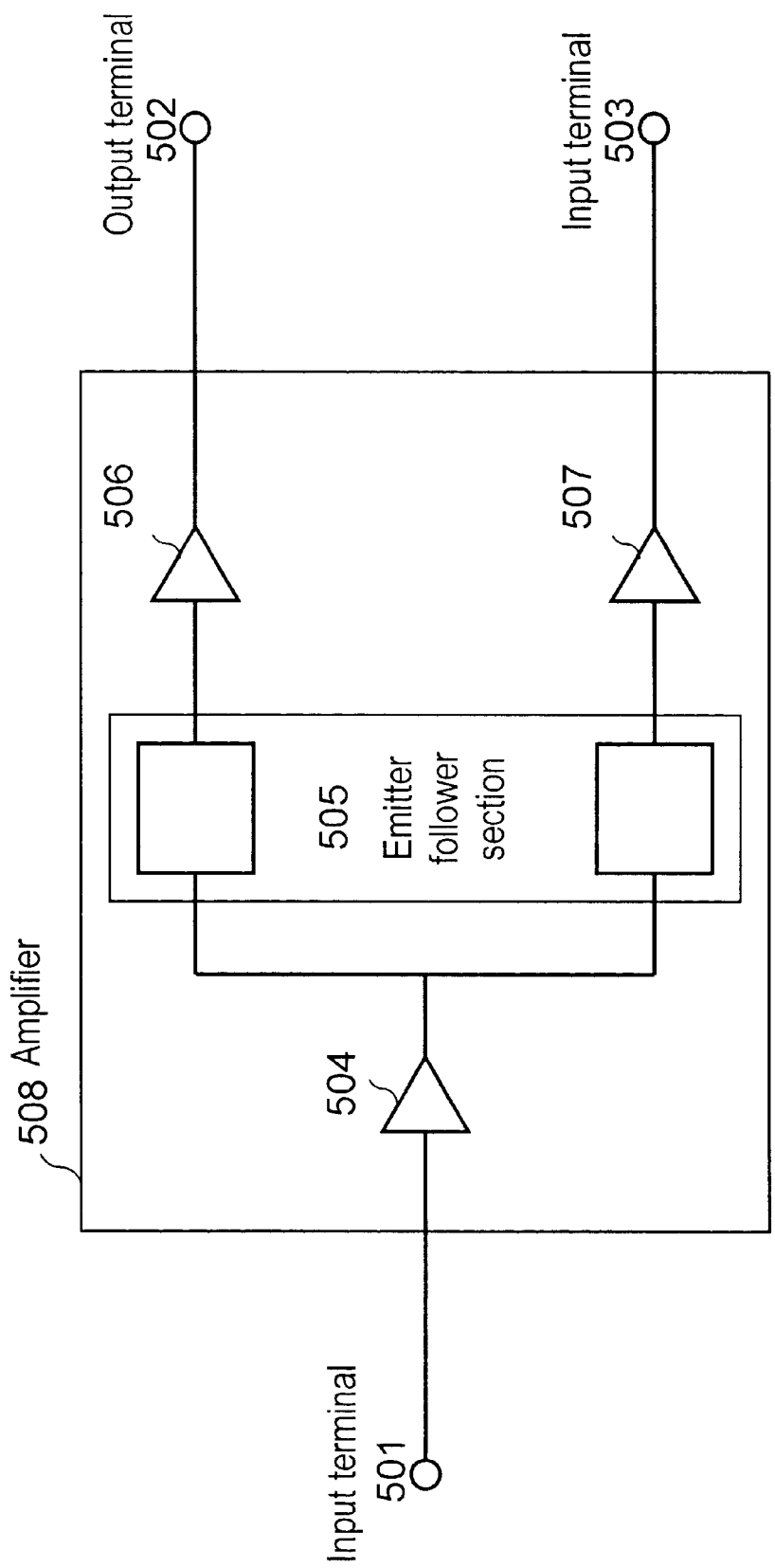
FIG. 5 is a circuit diagram of an amplifier in embodiment 5 of the invention.

In FIG. 5, in amplifier 508 is composed of a first stage amplifier 504, an emitter follower 505, a first buffer amplifier 506, and a second buffer amplifier 507. A signal is input into the amplifier 508 from an input terminal 501. The emitter follower section 505 includes a first emitter follower 515 and a second emitter follower 525. Branched signals are output from first and second output terminals 502, 503.

Since the emitter follower has higher input impedance than the emitter-grounded transistor is used as the output load of the first stage amplifier 504, the current of the first stage amplifier 504 can be curtailed. Since the later stage of the emitter follower is connected to the bases of the emitter-ground transistors of the first and second buffer amplifiers 506, 507, the output impedance of the emitter follower may be high. Therefore, since the emitter follower can be driven at low current, the current of the entire amplifier may be curtailed.

Meanwhile, as the first stage amplifier 504 and first and second buffer amplifiers 506, 507, either bipolar transistors or FETs may be used. Instead of the emitter follower, the source follower may be used. In a similar circuit constitution, further, when the number of branches is increased so as to distribute the signal into three or more portions, three or more output signals can be taken out.

Alternatively, the emitter follower section may be composed of one emitter follower. Then a plurality of buffer amplifiers may be connected to one emitter follower, and a plurality of output signals can be output.

(Embodiment 6)

Figure 6:
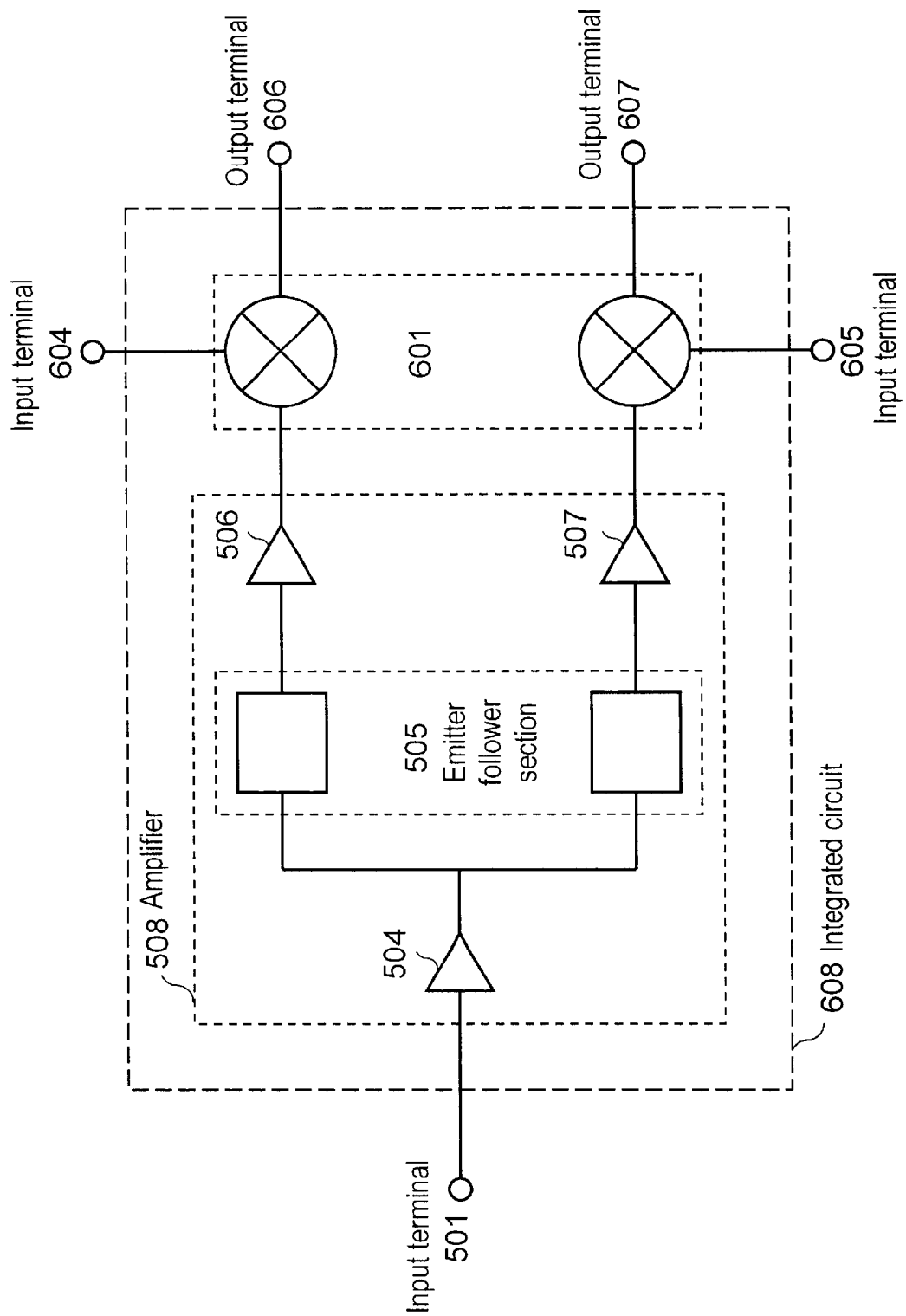
FIG. 6 is a circuit diagram of an amplifier in embodiments 6 and 7 of the invention.

In FIG. 6, an integrated circuit 607 includes an amplifier 508 and a mixer 601.

A local oscillation signal is input into an input terminal 501, and is amplified by the operation an(1 action of embodiment 5, and output from first and second buffer amplifiers 506, 507.

Each output signal is input into the mixer 601.

Mixers 1203, 1207 in FIG. 12 correspond to the mixer 601 in FIG. 6. The output of LPF 1202 in FIG. 12 is input into an input terminal 604 in FIG. 6, and is mixed with a local oscillation signal (corresponding to the output of the first local oscillator 1213 in FIG. 12) which is the output of the first buffer amplifier 506, and up-converted, and issued from an output terminal 606 in FIG. 6.

Then, the signal is amplified by the amplifier, and transmitted from the antenna.

The other constituent elements are same as in embodiment 5.

Thus, when the amplifier 505 is constituted in an integrated circuit together with two mixers, local input terminal is not needed in every mixer, and the number of terminals in the integrated circuit is curtailed.

Incidentally, when incorporating three or more mixers in one integrated circuit, by preparing the output terminals of the amplifier 508 by the same number of mixers, the local signal input terminals can be integrated into one.

(Embodiment 7)

Although not shown in FIG. 6, by reducing the transistor size of the transistors used in the mixer 601, the stray capacitance around the local signal input terminals 602, 603 is decreased. As a result, the impedance of the first and second local signal input terminals 602, 603 is higher, and the driving current of the first and second buffer amplifiers 506, 507 can be curtailed.

The transistors used in the mixer 601 may be either bipolar transistors or FETs. Here a diode formed by short-circuiting the base and collector of the bipolar transistor may be used.

Thus, according to the invention, by changing over the circuits making use of the cut-off voltage of transistor, matching of input impedance is maintained even when changing over the gains, and generation of higher order distortion can be prevented. By making, use of the high input impedance of the emitter follower, the amplifier can be operated at low current, and the signal can be branched off while hardly increasing the current of the integrated circuit, and the number of terminals may be curtailed.

(Embodiment 8)

Figure 7:
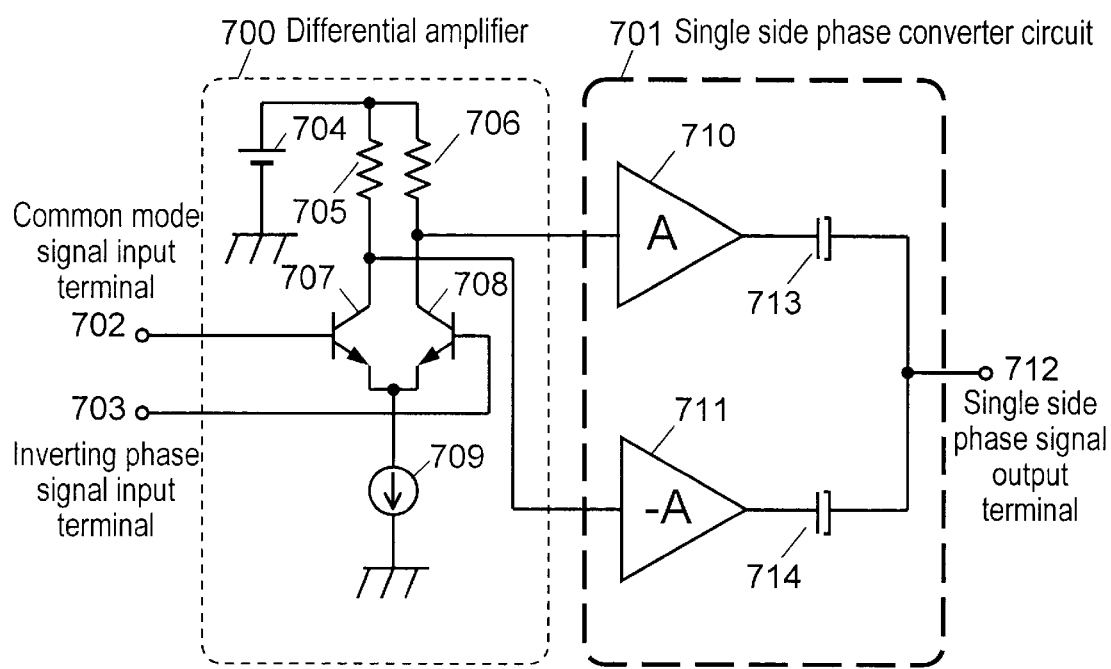
FIG. 7 is a circuit diagram of a single side phase converter in embodiment 8 of the invention.

In FIG. 12, in the transmitting, system, since the BPF 1205 and LPF 1202 have single phase signal input and output signal, the double side phase output signals such as those of the quadrature modulator 701 and up-mixer 703 composed of differential amplifiers shown in FIG. 7 must be converted into single side phase output signals.

Accordingly, the single side phase converter 1214 of the invention is placed between the BPF 1205 and up-mixer 1203, and between the LPF 1202 and quadrature modulator 1201 as shown in FIG. 12.

A specific constitution of the single side phase converter is shown below.

FIG. 7 shows a circuit diagram of a single side phase converter. In FIG. 7, a differential amplifier 700 is composed of a direct-current voltage source 704, transistors 707, 708 sharing a common emitter, load resistors 705, 706 connected to the collectors of the transistors 707, 708, and a direct-current current source 709 connected to the emitter of the transistor 707, 708. The single side phase converter 701 is composed of, for example, a non-inverting amplifier 710 having the gain "A" composed of an operational amplifier or the like, an inverting amplifier 711 having the gain "−A", and coupling capacitors 713, 714 for blocking the direct currents of the non-inverting amplifier 710 and inverting amplifier 711, respectively. FIG. 7 further shows common mode signal input terminals 702, and inverting phase signal input terminal 703 for receiving a signal differing in phase by 180 degrees from the common mode signal input terminal 702, and a single side phase signal output terminal 712.

In thus constituted single side phase converter, the operation is described below. First, the double side phase signals input from the common mode signal input terminal 702 and inverting phase signal input terminal 703 are amplified by the differential amplifier 700. To simplify the explanation of the operation, the gain of the differential amplifier 700 is one. At this time, a negative phase output signal appears at the collector terminal of the transistor 707, and a positive phase output signal appears at the collector terminal of the transistor 708.

This positive phase output signal over the load resistor 706 is amplified by " " times in positive phase by the non-inverting amplifier 710 composed of, for example, an operational amplifier. Similarly the negative phase output signal over the load resistor 705 is amplified by "−A" times in negative phase by the inverting amplifier 711 composed of, for example, an operational amplifier. The outputs 1from the non-inverting amplifier 710 and inverting amplifier 711 are of time same amplitude and the same phase. The coupling capacitors 713 and 714 block the direct current components of the output signals, combine the output signals. Therefore the signal being "2×A" times of the input signals appears at the single side phase signal output terminal 712. Since the in-phase noise components applied from outside are in reverse phase at same amplitude at the outputs of the non-inverting amplifier 710 and the inverting amplifier 711. They are canceled, and do not appear in the output signal.

Thus, according to the embodiment, by amplifying the positive phase input signal by the non-inverting amplifier, amplifying the negative phase input signal by the inverting amplifier, and by coupling their output signals, the double side phase output signal can be efficiently converted into a single side phase output signal, while maintaining the feature of the in-phase noise elimination.

The differential amplifier 700 is not limited to the amplifier, but a mixer or oscillator may the used as far as the type of output signal is double side phase output.

(Embodiment 9)

Figure 8:
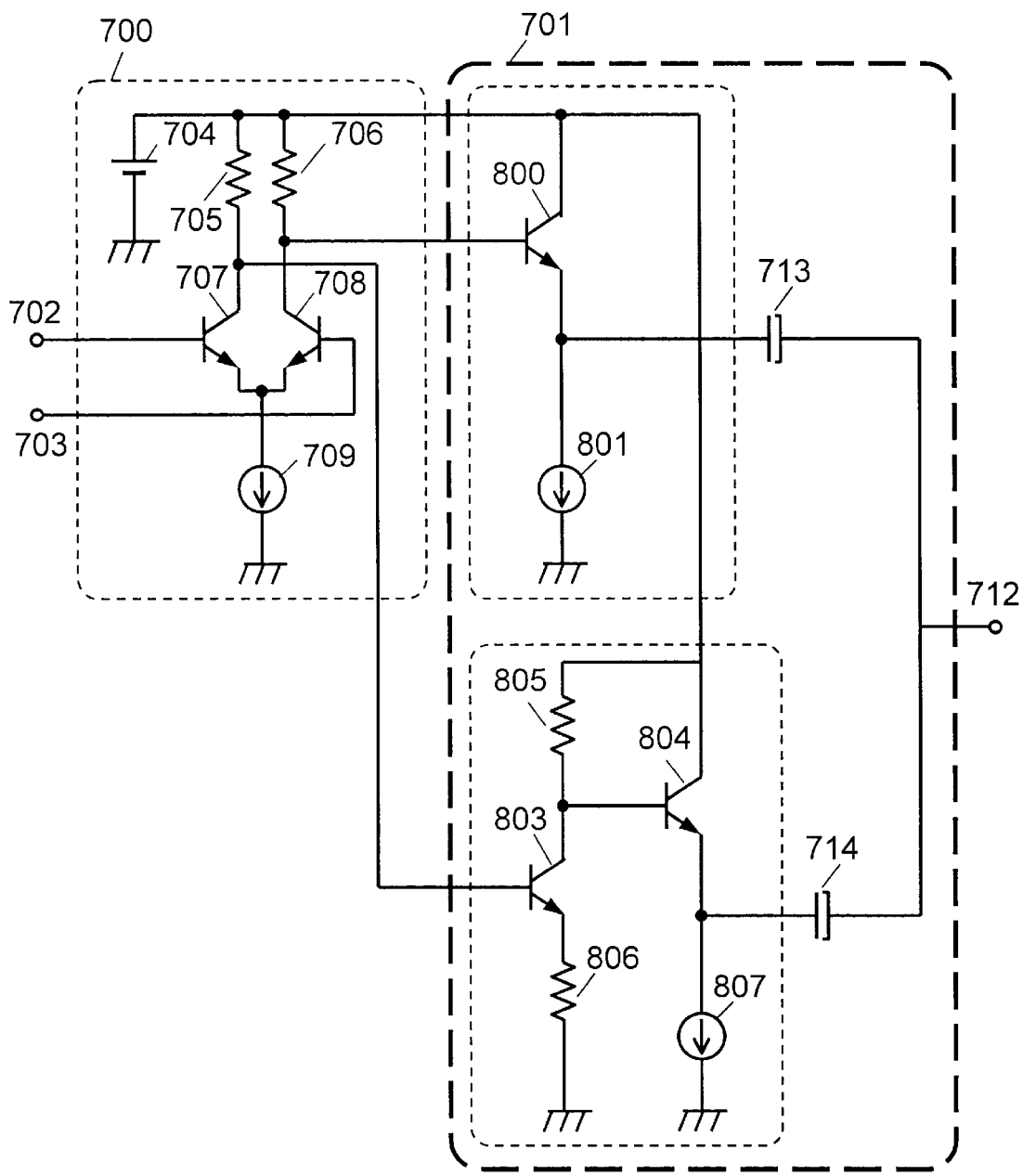
FIG. 8 is a circuit diagram of a single side phase converter in embodiment 9 of the invention.

FIG. 8 shows a circuit diagram of a single side phase converter. In FIG. 8, constituent elements identified with reference numerals 700 to 714 are same as the parts of embodiment 8 shown in FIG. 7, and their description is omitted. Constituent elements added to FIG. 7 are amplifying transistors 800, 803, 804, direct-current current sources 801, 807, a load resistor 805, and an emitter resistor 806 equal to the resistance value of the load resistor 805.

In thus constituted single side phase converter, the operation is described below. The transistor 800, direct-current current source 801, and direct-current blocking coupling capacitor 802 make up a non-inverting amplifier 110 having gain "1" an emitter follower structure. The emitter-grounded amplifier composed of transistor 803, load resistor 805, and emitter resistor 806 amplifies a signal in reverse phase by one times, because the load resistor 805 and emitter resistor 806 are equal in value. The output signal is received by the emitter follower circuit composed of transistor 804 and current source 807, so that an inverting amplifier 711 is composed having the gain "1" and the same output impedance as the non-inverting amplifier 710. Here the emitter follower circuit type realized in the minimum circuit scale is employed in the non-inverting amplifier 710. Moreover the series connection of the emitter-grounded type and emitter follower type circuit realized in the minimum circuit scale is employed in the inverting amplifier 711. Accordingly the circuit structure is substantially simplified as compared with the case of realizing by operational amplifiers. Other operations are in the same manner as in embodiment 8, and the description is omitted herein.

(Embodiment 10)

Figure 9:
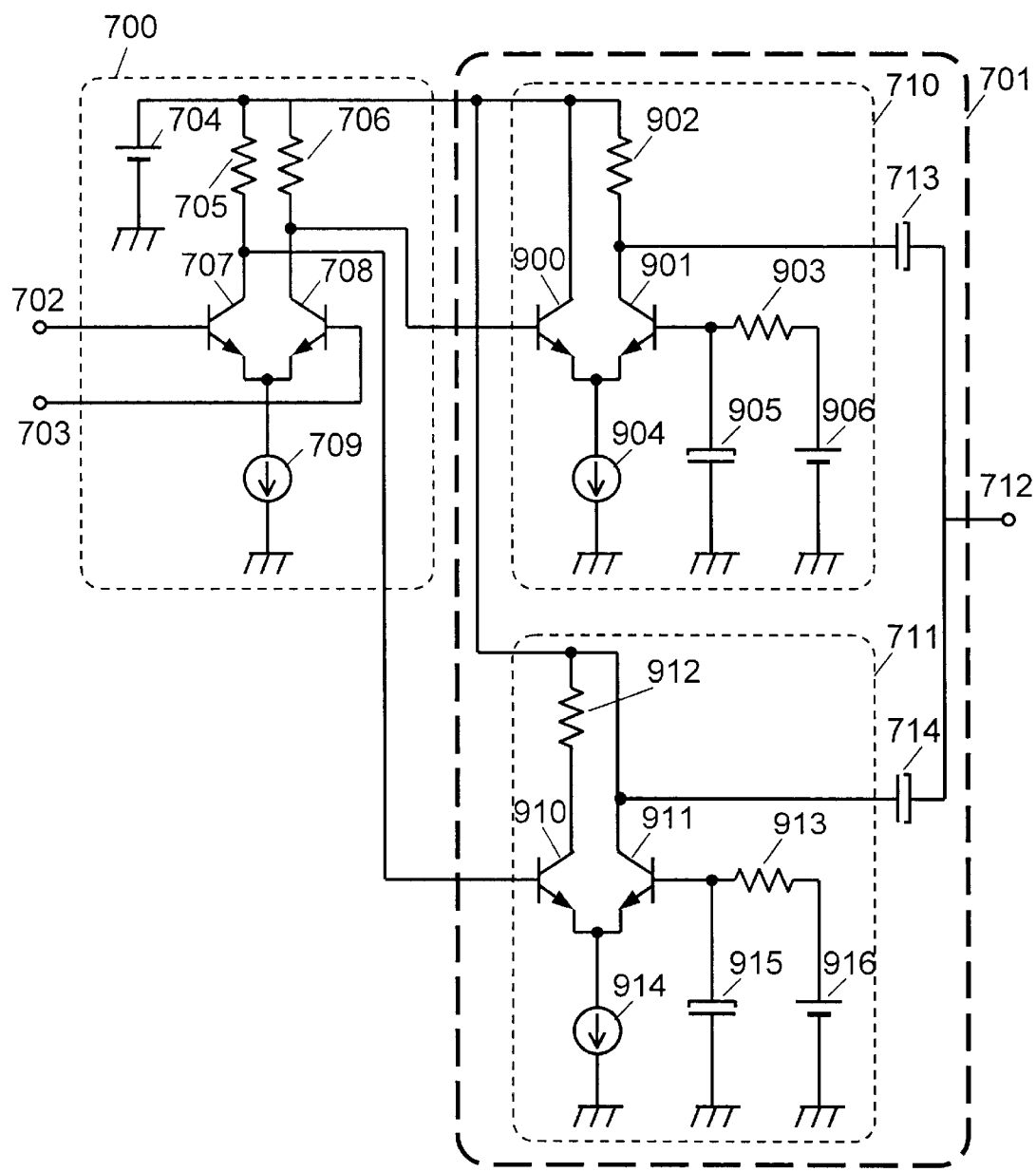
FIG. 9 is a circuit diagram of a single side phase converter in embodiment 10 of the invention.

FIG. 9 is a circuit diagram of a single side phase converter. In FIG. 9, constituent elements identified with reference numerals 700 to 714 are same as the elements of embodiment 1 shown in FIG. 7, and their description is omitted. Moreover there are amplifying transistors 900, 901, 910, 911, direct-current current sources 904, 914, bias power sources 906, 916, bias application resistors 903, 913, ground capacitors 905, 915, and load resistors 902, 912 connected to the collector terminals of the transistors 901, 910 respectively.

In thus constituted single side phase converter, the operation is described below. The transistors 900, 901, current source 904, transistors 910, 911, and current source 914 are differential amplifiers of single side phase input and single side phase output. The input terminals grounded via capacitors, that is, base terminals of the transistors 901, 911 are supplied with the bias voltages from the voltage sources 906, 916 through the bias application resistors 903, 913, and grounded at radio frequency through the grounding capacitors 905, 915. At this time, the non-inverting amplifier 710 picks up positive phase output from the collector output of the transistor 901 through the load resistor 902, and the inverting amplifier 711 operates on the type of picking up negative phase output from the collector output of the transistor 910. In the one integrated circuit, since the characteristics of transistors are uniform, the phase converting characteristic of the differential amplifier is very excellent. Thus as compared with the composition of emitter follower type, the single side phase converter excellent in eliminating capacity of in-phase noise can be realized. Other operations than above are same as in embodiment 1, and the description is omitted.

(Embodiment 11)

Figure 10:
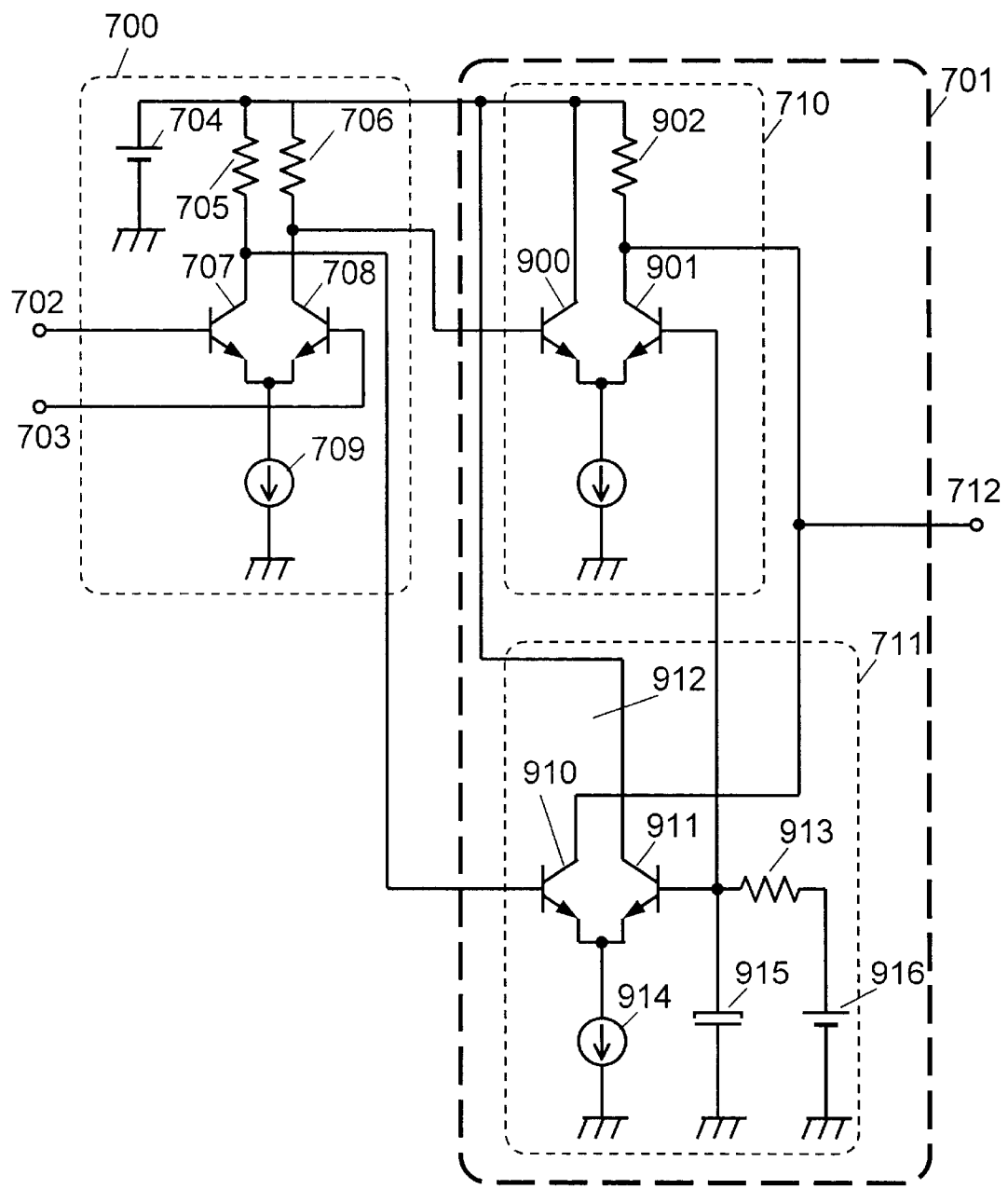
FIG. 10 is a circuit diagram of a single side phase converter in embodiment 11 of the invention.

FIG. 10 is a circuit (diagram of a single side phase converter. In FIG. 10, constituent elements identified with reference numerals 700 to 712 are same as the parts of embodiment 1 shown in FIG. 7, and constituent elements identified with reference numerals 900 to 902, 904, 910, 911, 913 to 916 are same as the parts of embodiment 10 shown in FIG. 9, and their description is omitted.

In thus constituted single side phase converter, the operation is described below while referring to FIG. 9 and FIG. 10. By using the load resistances 902 and 912 in FIG. 9 commonly, the load resistor 912, and the coupling capacitors 907, 917 required to avoid direct-current interference of the non-inverting amplifier 710 and inverting amplifier 711 are not needed as shown in FIG. 10. Also by using the base terminals of the transistors 901 and 911 in FIG. 9, which are at the side of input terminal grounded via a capacitor, commonly, the bias power source 906, bias application resistor 903, and ground capacitor 905 are not needed as shown in FIG. 10, and the circuit scale can be simplified significantly.

Other operations than above are same as in embodiment 8, and the description is omitted.

(Embodiment 12)

Figure 11:
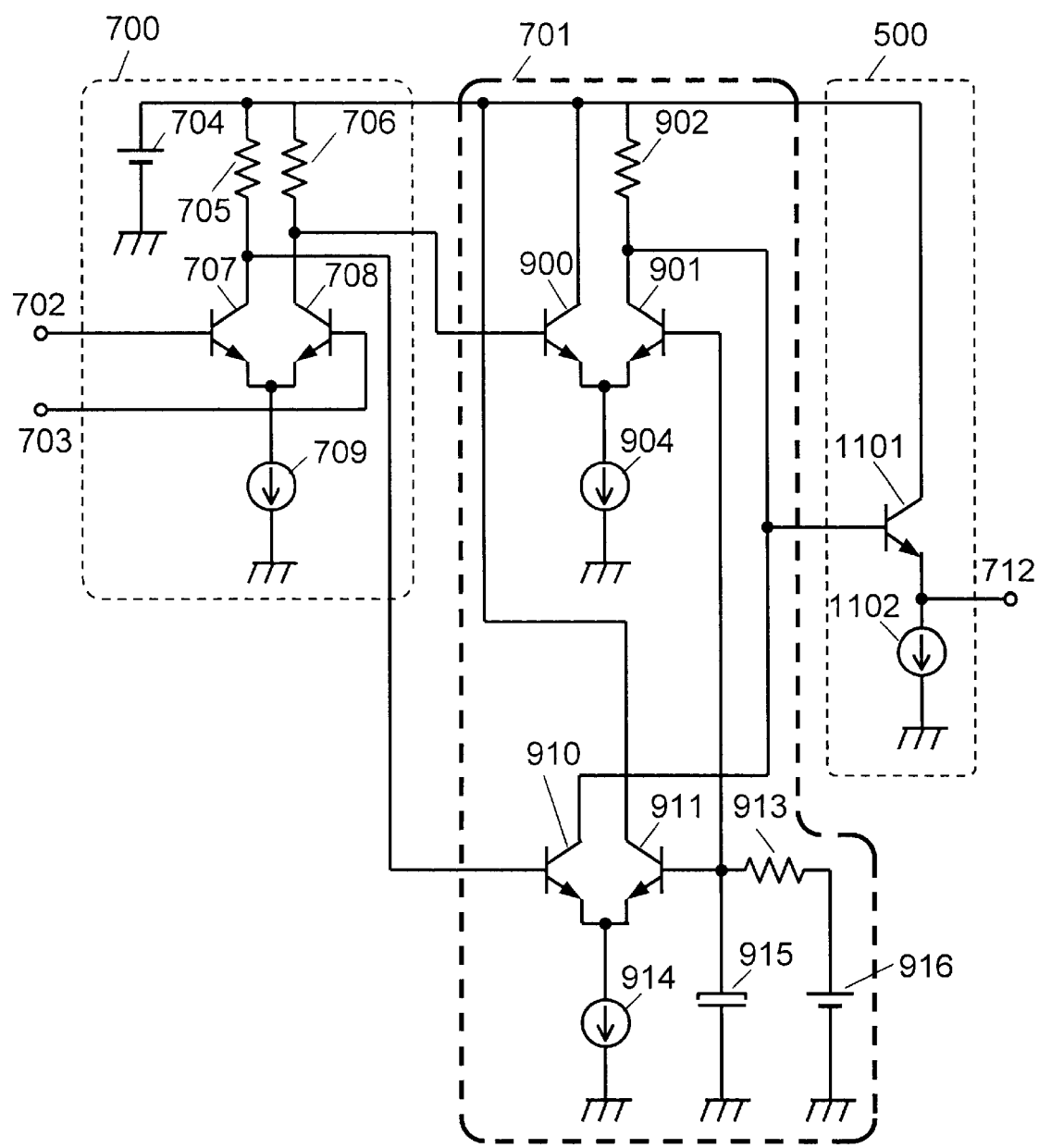
FIG. 11 is a circuit diagram of a single side phase converter in embodiment 12 of the invention.

FIG. 11 is a circuit diagram of single side phase converter. In FIG. 11, emitter follower 1100 is composed of an amplifying transistor 1101 and a current source 1102. Constituent members identified with reference numerals 700 to 709, and 712 are same as the elements of embodiment 8 shown in FIG. 7, and constituent members identified with reference numerals 900 to 902, 904, 910, 911, 913 to 916 are same as the elements in embodiment 9 shown in FIG. 9, and the description is omitted.

In thus constituted single side phase converter, the operation is described below while referring to FIG. 11. In FIG. 11, the emitter follower 1100 receives the output signal of the single side phase converter 701. Then the output impedance is converted into a low output impedance, so that the single side phase converter 701 is resistant to the effect of input impedance of the circuit connected in the next stage, such as the filter.

Thus, according to the invention, the positive phase input signal is amplified by the non-inverting amplifier, and the negative phase input signal is amplified by the inverting amplifier. Then the emitter follower combines their output signals through coupling capacitors. Thus in this constitution, the double side phase output signal can be efficiently converted into a single side phase output signal, while maintaining the feature of the in-phase noise elimination.

What is claimed is:

1. An amplifier, being a variable amplifier for obtaining a variable gain by changing over signal lines having different gains, comprising:

a first signal line having a cascade amplifier, a second signal line having a base-grounded amplifier, and control terminals provided independently in said cascade amplifier and said base-grounded amplifier, wherein one of said first line and said second signal line is selected by using said control terminals so that the gain is varied.

2. An amplifier according to claim 1, wherein said amplifier is included in a radio communication apparatus.

3. An amplifier comprising:

a cascade amplifier connecting the collector of a first transistor having the emitter grounded, and the emitter of a second transistor having the base grounded at radio frequency through a first grounding capacitor, a third transistor having the base grounded at radio frequency through a second ground capacitor, having the emitter connected to the base of said first transistor, and having the collector connected to the collector of said second transistor, a fourth transistor as a constant current source to be connected to the emitter of said third transistor, and a bias changeover circuit for supplying base biases of said first, second, third, and fourth transistors, wherein the gain is changed over by operating one of the cascade amplifier and the third transistor by using said bias changeover circuit.

4. The amplifier of claim 3, further comprising:

a resistor for connecting the base of said first transistor and the emitter of said third transistor, wherein the emitter of said third transistor and the collector of said fourth transistor are connected through said resistor.

5. The amplifier of claim 3, further comprising:

a resistor for connecting the connecting point of the emitter of said third transistor and the collector of said fourth transistor, and the base of said first transistor.

6. The amplifier of claim 3, further comprising:

a resistor for attenuating the output signal of said third transistor, and a fifth transistor connecting the emitter thereof to said resistor, and short-circuiting the base and collector thereof, wherein the collector of said second transistor and the collector of said third transistor are connected through said fifth transistor and said resistor, the collector of said fifth transistor and the collector of said second transistor are connected, and the damping action by said resistor to the output power of the cascade amplifier at high gain is suppressed by making use of the separation between the collector and emitter in non-action state of said fifth transistor.

7. The amplifier of claim 3, further comprising:

an impedance adjusting circuit making use of bonding wire, provided between the emitter said cascade amplifier and the ground.

8. An amplifier according to claim 3, wherein said amplifier is included in a radio communication apparatus.

9. An amplifier according to claim 4, wherein said amplifier is included in a radio communication apparatus.

10. An amplifier according to claim 5, wherein said amplifier is included in a radio communication apparatus.

11. An amplifier according to claim 6, wherein said amplifier is included in a radio communication apparatus.

12. An amplifier according to claim 7, wherein said amplifier is included in a radio communication apparatus.

* * * * *

UNITED STATES PATENT AND TRADEMARK OFFICE
CERTIFICATE OF CORRECTION

PATENT NO.     : 6,331,804 B1
DATED          : December 18, 2001
INVENTOR(S)    : Shimizu et al.

It is certified that error appears in the above-identified patent and that said Letters Patent is hereby corrected as shown below:

Drawings,
Delete "Fig. 2A" and replace with -- Fig. 2A -- as shown on the attached sheet.

Signed and Sealed this

Second Day of November, 2004

JON W. DUDAS
*Director of the United States Patent and Trademark Office*